(12) United States Patent
Hasebe et al.

(10) Patent No.: US 8,728,957 B2
(45) Date of Patent: May 20, 2014

(54) THIN FILM FORMATION METHOD AND FILM FORMATION APPARATUS

(75) Inventors: Kazuhide Hasebe, Nirasaki (JP);
Akinobu Kakimoto, Nirasaki (JP)

(73) Assignee: Tokyo Electron Limited (JP)

( * ) Notice: Subject to any disclaimer, the term of this patent is extended or adjusted under 35 U.S.C. 154(b) by 284 days.

(21) Appl. No.: 13/095,503

(22) Filed: Apr. 27, 2011

(65) Prior Publication Data
US 2011/0269315 A1    Nov. 3, 2011

(30) Foreign Application Priority Data

May 1, 2010 (JP) ................................. 2010-106031
Mar. 1, 2011 (JP) ................................. 2011-043771

(51) Int. Cl.
*H01L 21/18* (2006.01)
*C23C 16/52* (2006.01)

(52) U.S. Cl.
USPC .......................................... 438/784; 438/783

(58) Field of Classification Search
CPC .............. C23C 16/22; C23C 16/45525; H01L 21/0243; H01L 21/0262; H01L 21/0245
USPC .................................................. 438/783, 784
See application file for complete search history.

(56) References Cited

U.S. PATENT DOCUMENTS 7,462,571 B2 * 12/2008 Hasebe et al. ................ 438/791
2007/0087581 A1 * 4/2007 Singh et al. ................... 438/780

FOREIGN PATENT DOCUMENTS

| JP | 61-034928 | 2/1986 |
| JP | 05-251357 | 9/1993 |
| JP | 08-153688 | 6/1996 |

* cited by examiner

*Primary Examiner* — Alexander Ghyka
(74) *Attorney, Agent, or Firm* — Cantor Colburn LLP

(57) ABSTRACT

A thin film formation method to form a silicon film containing an impurity on a surface of an object to be processed in a process chamber that allows vacuum exhaust includes alternately and repeatedly performing a first gas supply process in which a silane-based gas composed of silicon and hydrogen is supplied into the process chamber in a state that the silane-based gas is adsorbed onto the surface of the object to be processed and a second gas supply process in which an impurity-containing gas is supplied into the process chamber, to form an amorphous silicon film containing an impurity. Accordingly, an amorphous silicon film containing an impurity having good filling characteristics can be formed even at a relatively low temperature.

9 Claims, 13 Drawing Sheets

<FIRST EMBODIMENT OF FILM FORMATION METHOD>

<SECOND EMBODIMENT OF FILM FORMATION METHOD>

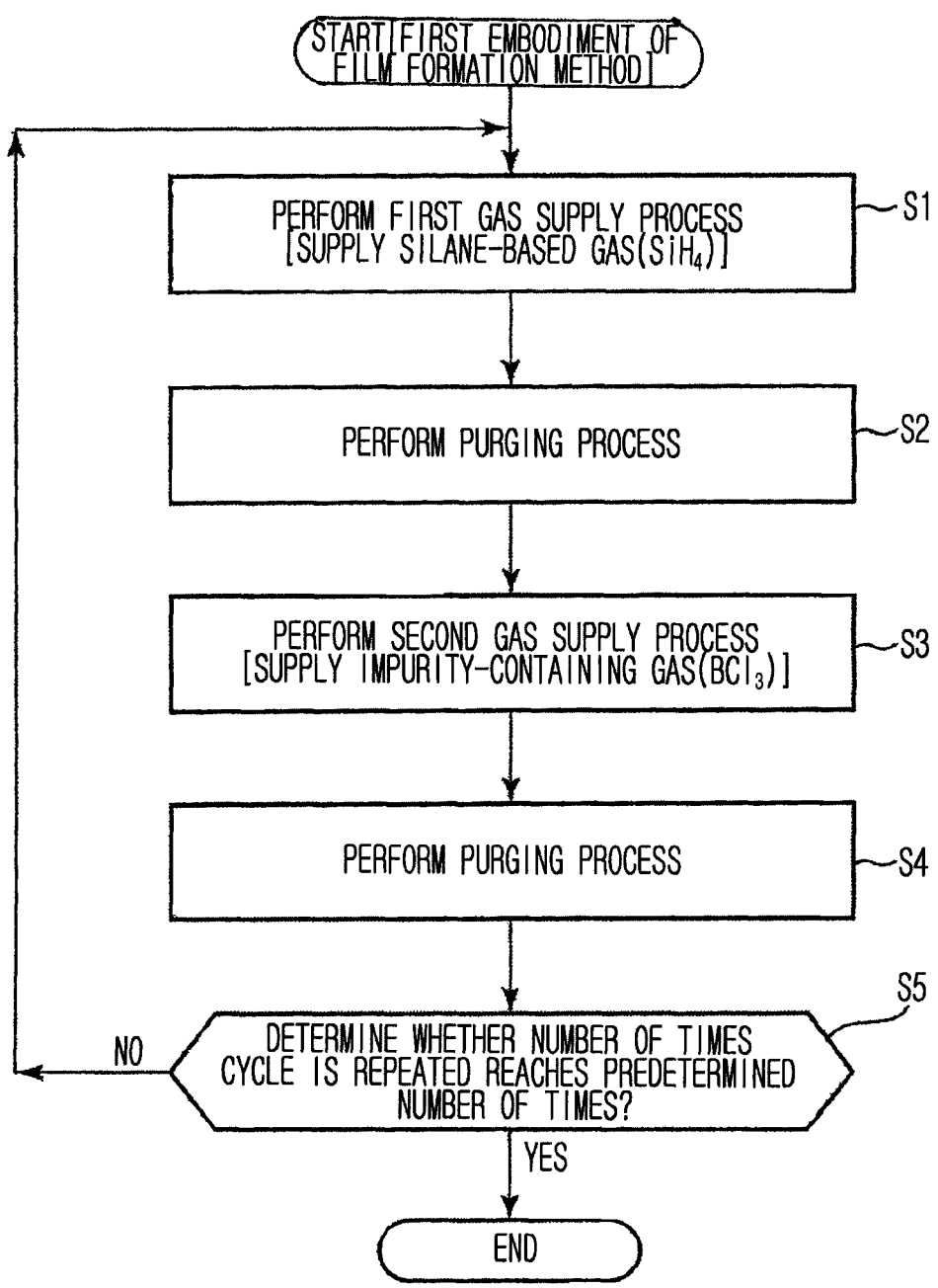

<FIRST EMBODIMENT OF
FILM FORMATION METHOD>

<SECOND EMBODIMENT OF
FILM FORMATION METHOD>

<ANNEALING PROCESS>

THIN FILM FORMATION METHOD AND FILM FORMATION APPARATUS

CROSS-REFERENCE TO RELATED PATENT APPLICATIONS

This application claims the benefits of Japanese Patent Application No. 2010-106031, filed on May 1, 2010 and Japanese Patent Application No. 2011-043771, filed on Mar. 1, 2011, in the Japan Patent Office, the disclosures of which are incorporated herein in its entirety by reference.

BACKGROUND OF THE INVENTION

1. Field of the Invention

The present invention relates to a film formation method and a film formation apparatus which form a thin film containing an impurity on a surface of an object to be processed such as a semiconductor wafer or the like.

2. Description of the Related Art

In general, various processes, such as film formation, etching, oxidation, diffusion, surface modification, native oxide removal, or the like, are performed on a semiconductor wafer including a silicon substrate or the like in order to manufacture a semiconductor integrated circuit. From among the various processes, film formation will be exemplarily explained. During manufacture of a semiconductor integrated circuit, for example, a DRAM or the like, film formation process may be performed by forming recess portions, such as contact holes, through-holes, wiring grooves, cylindrical grooves of a capacitor having a cylindrical structure, or the like, in an insulating film formed on a surface of a semiconductor wafer and filling the recess portions with a conductive thin film.

A silicon film containing an impurity has been conventionally used as the thin film filled in the recess portions, because the silicon film has a relatively good step coverage and a relatively low cost. A method of filling the recess portions will be explained with reference to FIGS. 12A and 12B. FIGS. 12A and 12B are views showing an example where recess portions formed on a surface of a semiconductor wafer are filled.

As shown in FIG. 12A, an insulating film 2 formed of, for example, $SiO_2$ or the like, is thinly formed on a surface of a semiconductor wafer W including, for example, a silicon substrate or the like, which is an object to be processed, and recess portions 4 are formed in the insulating film 2. The recess portions 4 are contact holes for contact with a lower layer or the substrate itself, through-holes, wiring grooves, cylindrical grooves of a capacitor having a cylindrical structure, or the like. Contact holes for contact with the substrate itself are exemplarily shown in FIG. 12A. And, as shown in FIG. 12B, a conductive thin film 6 is formed on the surface of the semiconductor wafer W in order to fill the recess portions 4. A silicon film containing an impurity is often used as the thin film 6 as described above.

As a film formation method of forming the thin film 6, a film formation method (Patent Reference 1) of forming a single crystalline thin film including an impurity at a low pressure of about 1 to $10^{-6}$ Pa by alternately supplying a gas including an element of silicon that is a semiconductor, for example, $SiCl_4$ or the like, and a gas including an impurity element, such as $BCl_3$ or the like, a film formation method (Patent Reference 2) of alternately forming a polysilicon layer by supplying, for example, a monosilane ($SiH_4$) gas, and a phosphorus adsorptive layer by supplying a phosphine gas, a film formation method (Patent Reference 3) of forming a film by CVD (Chemical Vapor Deposition) by simultaneously supplying monosilane and boron trichloride ($BCl_3$), and so on are known.

3. Prior Art Reference (Patent Reference 1) Japanese Patent Laid-Open Publication No. sho 61-034928

(Patent Reference 2) Japanese Patent Laid-Open Publication No. hei 05-251357

(Patent Reference 3) Japanese Patent Laid-Open Publication No. hei 08-153688

SUMMARY OF THE INVENTION

By the way, when a request for miniaturization is not so high that design rules are relatively simple, filling up the recess portions as described above is favorably performed and each of the aforesaid film formation methods has achieved good filling characteristics due to a high step coverage. However, as a request for miniaturization has increased and thus design rules become stricter in recent years, sufficient filling characteristics cannot be achieved. Also, as shown in, for example, FIG. 12B, a void 8, which is not negligible, is formed in a film, thereby increasing a contact resistance.

In particular, recently, as a strict design rule in which a hole diameter of each of recess portions 4 is equal to or less than 40 nm and an aspect ratio of each of the recess portions 4 is equal to or greater than 10 is requested, there is a demand for a method for solving the aforesaid problems at an early stage.

Considering the aforesaid problems, the present invention has been made to effectively solve the problems. The present invention provides a thin film formation method and a film formation apparatus which can form an amorphous thin film, such as a silicon film or a silicon germanium film containing an impurity, having good filling characteristics even at a relatively low temperature.

The invention according to claim 1 provides a thin film formation method to form a silicon film containing an impurity on a surface of an object to be processed in a process chamber that allows vacuum exhaust, the method including: alternately and repeatedly performing a first gas supply process in which a silane-based gas composed of silicon and hydrogen is supplied into the process chamber in a state that the silane-based gas is adsorbed onto the surface of the object to be processed and a second gas supply process in which an impurity-containing gas is supplied into the process chamber, to form an amorphous silicon film containing an impurity.

The invention according to claim 8 provides a thin film formation method to form a silicon film containing an impurity on a surface of an object to be processed in a process chamber that allows vacuum exhaust, the method including: alternately and repeatedly performing a first gas supply process in which a silane-based gas composed of silicon and hydrogen and a germanium-based gas composed of germanium and hydrogen are supplied into the process chamber in a state that the silane-based gas and the germanium-based gas are adsorbed onto the surface of the object to be processed and a second gas supply process in which an impurity-containing gas is supplied into the process chamber, to form an amorphous silicon germanium film containing the impurity.

The invention according to claim 15 provides a thin film formation method, the method including performing the thin film formation method of claim 1 and then performing the thin film formation method of claim 8.

The invention according to claim 17 provides a film formation apparatus for forming a thin film containing an impurity on a surface of an object to be processed, the film formation apparatus including: a process chamber in which the object to be processed is able to be housed; a holding unit which holds the object to be processed in the process chamber; a heating unit which heats the object to be processed; a gas supply unit which supplies a necessary gas into the process chamber; a vacuum exhaust system which evacuates an atmosphere in the process chamber; and a control unit which controls an overall operation of the apparatus in order to perform the thin film formation method of claim 1.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 3 is a flowchart showing an example of each process of the first embodiment of the method of the present invention;

DETAILED DESCRIPTION OF THE INVENTION

Embodiments for the Invention

Figure 1:
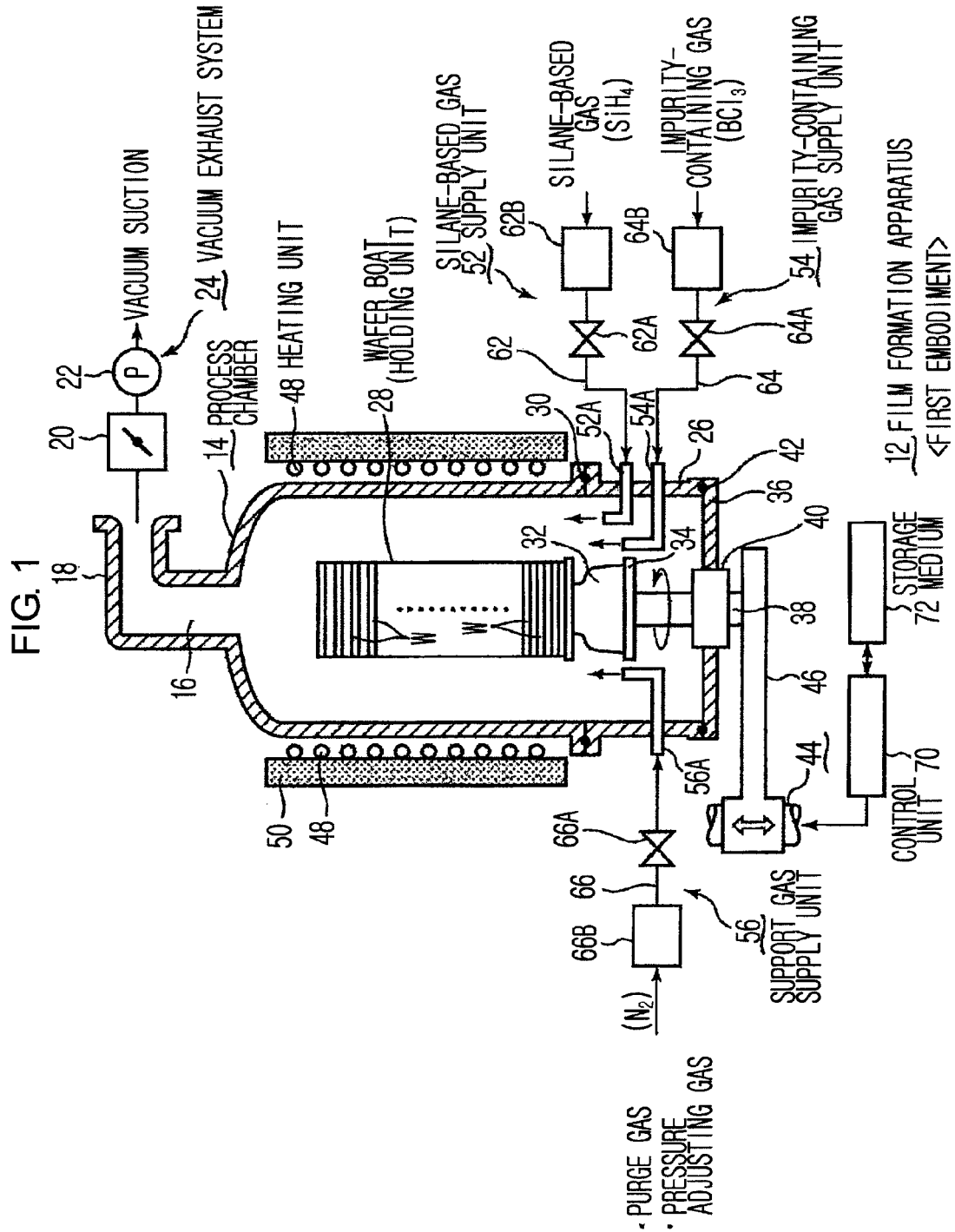
FIG. 1 is a structural view showing an example of a first embodiment of a film formation apparatus for performing a method of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Hereinafter, a thin film formation method and a film formation apparatus according to an embodiment of the present invention will be explained in detail with reference to the attached drawings.

First Embodiment

FIG. 1 is a structural view showing an example of a first embodiment of a film formation apparatus for performing a method of the present invention. As shown, the film formation apparatus 12 includes a batch type vertical process chamber 14 having a cylindrical shape with an open lower end. The process chamber 14 may be formed of, for example, quartz with high thermal resistance.

An open exhaust port 16 is provided in a ceiling portion of the process chamber 14, and an exhaust nozzle 18, which is bent, for example, in a horizontal direction perpendicular to a vertical direction, is continuously installed in the exhaust port 16. And, a vacuum exhaust system 24 including a pressure control valve 20, a vacuum pump 22, or the like is connected to the exhaust nozzle 18, so that an atmosphere in the process chamber 14 can be evacuated due to vacuum suction.

The lower end of the process chamber 14 is supported by a manifold 26 having a cylindrical shape and formed of, for example, stainless steel, and a wafer boat 28 formed of quartz is provided as a holding unit, on which a plurality of semiconductor wafers W which are objects to be processed are stacked from a lower side of the process chamber 14 at predetermined pitches, such that the wafer boat 28 can be lowered and raised and freely inserted into and separated from the manifold 26. A sealing member 30, such as an O-ring or the like, is interposed between the lower end of the process chamber 14 and an upper end of the manifold 26, to hermetically maintain a space between the lower end of the process chamber 14 and the upper end of the manifold 26. In the present embodiment, for example, about 50 to 100 semiconductor wafers W each having a diameter of about 300 mm can be supported at substantially regular pitches on the wafer boat 28. Also, there may be an example of an apparatus in which a portion of the manifold 26 is integrally molded with the process chamber 14 by using quartz.

The wafer boat 28 is placed on a table 34 with a Dewar flask 32 formed of quartz therebetween, and the table 34 is supported on an upper end portion of a rotating shaft 38 that penetrates through a cover 36 that opens and closes a lower end opening of the manifold 26. And, for example, a magnetic fluid seal 40 is installed in a portion of the rotating shaft 38 penetrating through the cover 36, so that the rotating shaft 38 is hermetically sealed and rotatably supported. Also, a sealing member 42, such as an O-ring or the like, is installed in a lower end portion of the manifold 26 and a peripheral portion of the cover 36, so that the inside of the process chamber 14 is sealed.

The rotating shaft 38 is attached to a front end of an arm 46 that is supported by a lifting mechanism 44, for example, a boat elevator or the like, so that the wafer boat 28, the cover 36, and the like can be integrally lowered and raised. Also, by fixedly installing the table 34 to the cover 36, the semiconductor wafers W may be processed without rotating the wafer boat 28.

A heating unit 48 including a heater formed of a carbon wire is installed beside the process chamber 14 to surround the process chamber 14, so that the semiconductor wafers W located inside the process chamber 14 can be heated. Also, a heat insulator 50 is installed at an outer periphery of the heating unit 48, so that thermal stability is ensured. And, various gas supply units for introducing and supplying various gases into the process chamber 14 are installed at the manifold 26.

In detail, a silane-based gas supply unit 52, which supplies a silane-based gas for film formation composed of silicon and hydrogen into the process chamber 14, and an impurity-containing gas supply unit 54, which supplies an impurity-containing gas into the process chamber 14, are respectively installed at the manifold 26. Also, here, if necessary, a support gas supply unit 56 for supplying a purge gas or a pressure adjusting gas into the process chamber 14 is installed at the manifold 26. Here, a $N_2$ gas is used as the purge gas or the pressure adjusting gas. Also, a rare gas, such as Ar, He, or the like, may be used instead of the $N_2$ gas.

The silane-based gas supply unit 52, the impurity-containing gas supply unit 54, and the support gas supply unit 56 respectively include gas nozzles 52A, 54A, and 56A which penetrate through a side wall of the manifold 26 and have front end portions extending into the process chamber 14. Gas passages 62, 64, and 66 are respectively connected to the gas nozzles 52A, 54A, and 56A, and opening/closing valves 62A, 64A, and 66A and flow rate controllers 62B, 64B, and 66B, such as mass flow controllers, are sequentially installed in the gas passages 62, 64, and 66, so that a silane-based gas, an impurity-containing gas, or a $N_2$ gas flows at controlled flow rates. Here, a silane-based gas composed of silicon and hydrogen as described, that is, a silane-based gas composed of only silicon and hydrogen, for example, monosilane, is used as the silane-based gas, a $BCl_3$ gas is used as the impurity-containing gas, and the $N_2$ gas is used as a purge gas or a pressure adjusting gas.

And, a control unit 70 including, for example, a micro computer or the like, is installed in the film formation apparatus in order to control the supply of each gas to be started or stopped, a process temperature, a process pressure, and so on, or in order to control an overall operation of the film formation apparatus. The control unit 70 includes a storage medium 72 in order to store a program used to control an operation of the film formation apparatus 12. The storage medium 72 includes, for example, a flexible disc, a CD (Compact Disc), a hard disc, a flash memory, a DVD, or the like.

Next, a first embodiment of a film formation method of the present invention which is performed by using the film formation apparatus 12 of the first embodiment constructed as described above will be explained. Each operation described below is performed under the control of the control unit 70 including a computer as described above.

Figure 2:
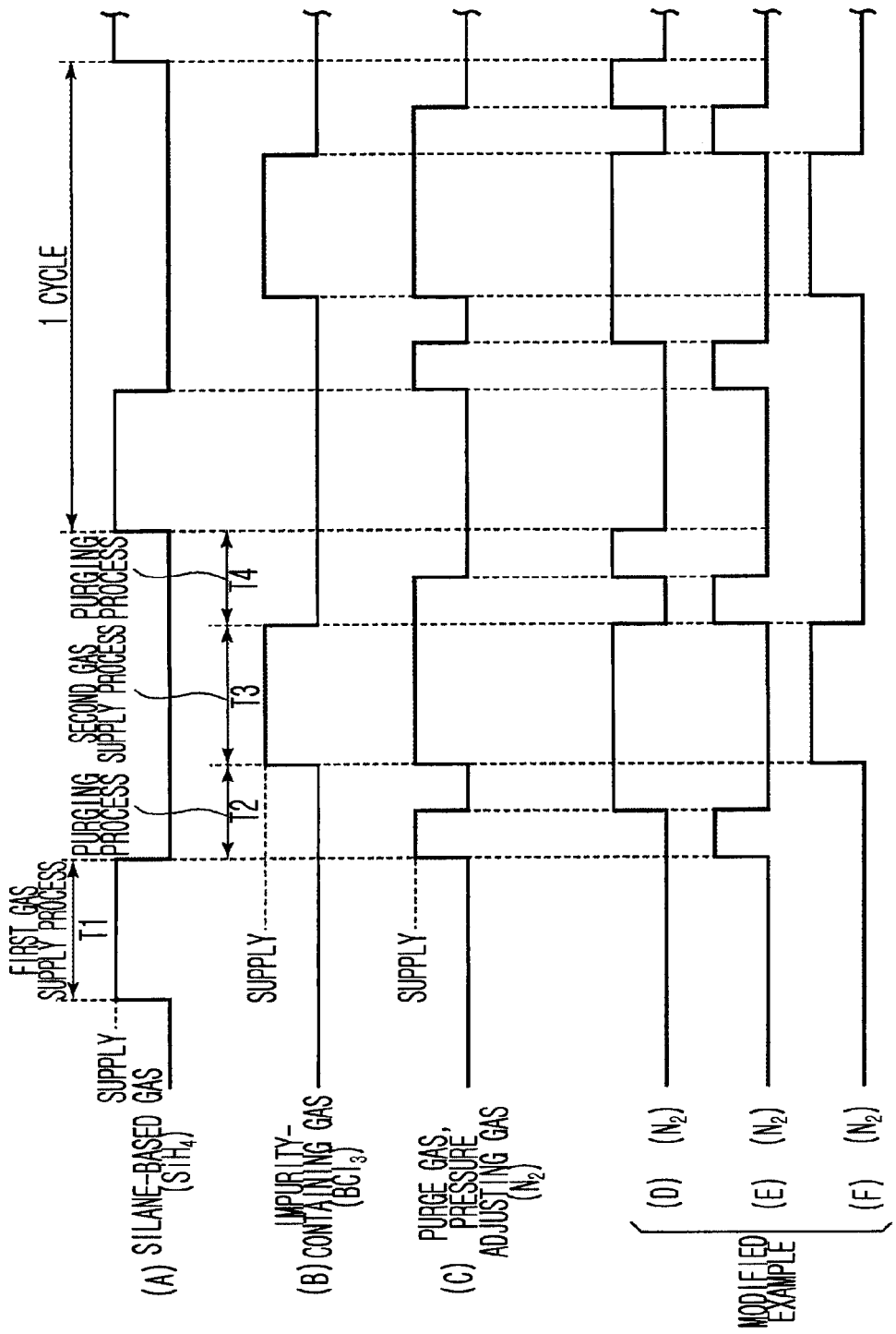
FIG. 2 is a timing chart showing an example of each gas supply type in a first embodiment of the method of the present invention.
Figure 4A:
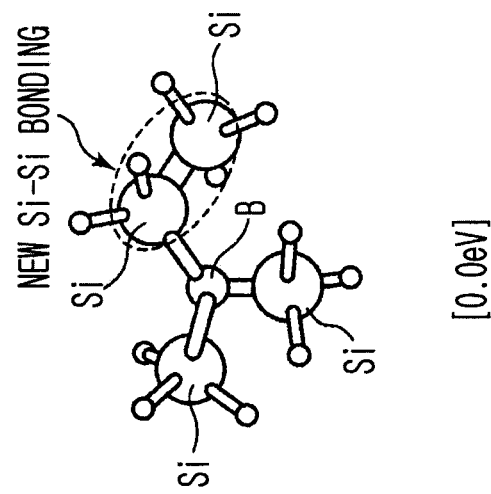
FIGS. 4A through 4C are views schematically showing a reaction process between $SiH_4$ and $BCl_3$.
Figure 4B:
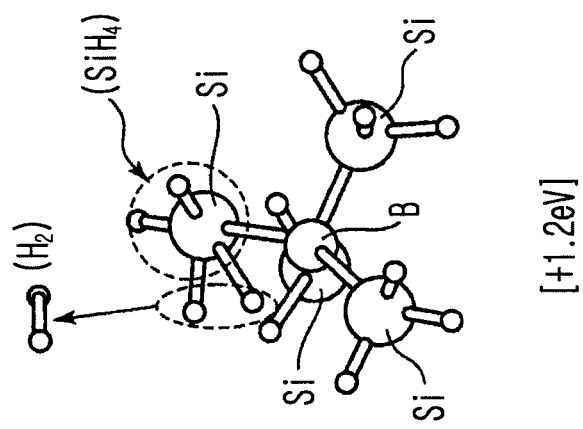
Figure 4C:
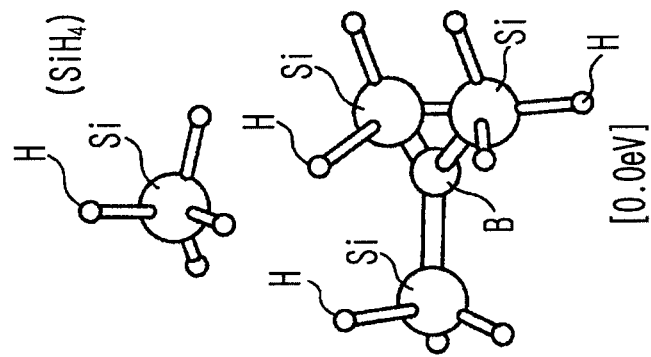

FIG. 2 is a timing chart showing an example of each gas supply type in the first embodiment of the method of the present invention, FIG. 3 is a flowchart showing an example of each process of the first embodiment of the method of the present invention, and FIGS. 4A through 4C are views schematically showing a reaction process between $SiH_4$ and $BCl_3$. The method of the present invention forms an amorphous silicon film containing an impurity by alternately and repeatedly performing a first gas supply process in which a silane-based gas composed of silicon and hydrogen is supplied into the process chamber 14 in a state that the silane-based gas is adsorbed onto a surface of the semiconductor wafer W and a second gas supply process in which an impurity-containing gas is supplied into the process chamber 14.

In the timing chart of FIG. 2, a portion where a pulse is high means that a gas is being supplied. In detail, a first gas supply process (S1 of FIG. 3) is first performed by supplying, for example, a $SiH_4$ (monosilane) gas, as a silane-based gas into the process chamber 14 (see a timing chart (A) of FIG. 2). In the first gas supply process, the monosilane gas is supplied in a state that the monosilane gas is adsorbed onto a surface of a semiconductor wafer W that is an object to be processed. Next, a purging process (S2 of FIG. 3) in which a remaining gas in the process chamber 14 is removed is performed (see a timing chart (C) of FIG. 2). Also, the purging process may be omitted.

Next, a second gas supply process (S3 of FIG. 3) is performed by supplying, for example, a $BCl_3$ gas, as an impurity-containing gas into the process chamber 14 (see a timing chart (B) of FIG. 2). Accordingly, the $BCl_3$ gas reacts with $SiH_4$ adsorbed onto the surface of the semiconductor wafer W to form a very thin silicon film doped with boron (B) having a thickness of, for example, a 1 atomic level.

Next, a purging process (S4 of FIG. 3) in which a remaining gas in the process chamber 14 is removed is performed again (see the timing chart (C) of FIG. 2). Also, the purging process may be omitted. And, in step S5 of FIG. 3, it is determined whether the number of times a 1 cycle including the steps S1 through S4 is repeated reaches a predetermined number of times. Here, the 1 cycle refers to a period of time from when a first gas supply process (S1) is performed to when a next first gas supply process (S1) is performed.

If it is determined in the step S5 that the number of times the 1 cycle is repeated does not reach the predetermined number of times (NO of S5), the method returns to the step S1 and the steps S1 through S4 are repeatedly performed until the number of times the 1 cycle is repeated reaches the predetermined number of times, to stack an amorphous silicon film doped with boron. And, if the number of times the 1 cycle is repeated reaches the predetermined number of times (YES of S5), film formation is finished. The film formation method is called a so-called ALD (Atomic Layer Deposition).

Figure 12A:
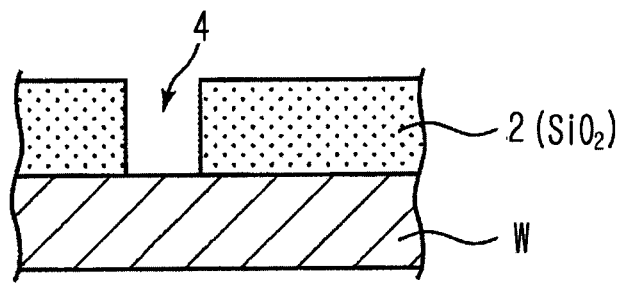
FIGS. 12A and 12B are views showing an example where recess portions formed on a surface of a semiconductor wafer are filled.
Figure 12B:
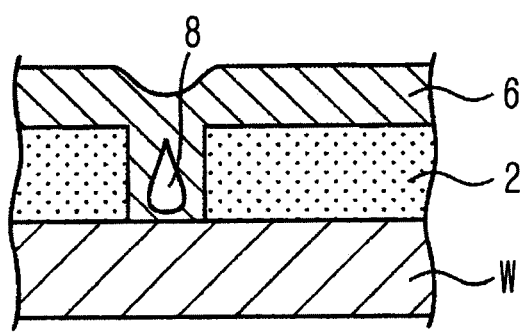

Actually, first, a plurality of semiconductor wafers W which are not processed yet are supported on the wafer boat 28 in a multistage manner, are transferred from the lower side of the process chamber 14 into the process chamber 14, which is previously heated, and are housed in a sealed state. A diameter of each of the semiconductor wafers W is, for example, 300 mm, and here, about 50 to 100 units of the semiconductor wafer W are housed. On a surface of each of the semiconductor wafers W, in a previous process, for example, an insulating layer 2 is formed as described above with reference to FIGS. 12A and 12B, and recess portions 4, such as contact holes or wiring grooves, are formed in the insulating layer 2.

An atmosphere in the process chamber 14 is always vacuum sucked by the vacuum exhaust system 24 during film formation and thus a pressure in the process chamber 14 is adjusted. Also, the semiconductor wafer W is rotated at a predetermined rate during film formation by rotating the wafer boat 28. And, various gases are sequentially and repeatedly supplied into the process chamber 14 as described above to perform the film formation. In the first gas supply process (S1), the monosilane gas is supplied at a controlled flow rate from the gas nozzle 52A of the silane-based gas supply unit 52. The monosilane gas is adsorbed onto the surface of the semiconductor wafer W that is rotated while being raised in the process chamber 14, and a residual gas is evacuated by the vacuum exhaust system 24 through the exhaust port 16 and the exhaust nozzle 18 of an upper portion of the process chamber 14.

Process conditions at this time are as follows: a flow rate of the monosilane gas ranges from 100 to 4000 sccm, and is, for example, about 1200 sccm, a process pressure ranges from 27 to 6665 Pa (0.2 to 50 Torr), and is, for example, about 533 Pa (4 Torr), a process temperature ranges from 350 to 600° C., and is, for example, about 400° C., and a gas supply period of time T1 ranges from 1 to 300 sec, and is, for example, about 60 sec.

Here, if the process temperature is lower than 350° C., it is not preferable because it is difficult for monosilane to be adsorbed onto the surface of the semiconductor wafer W. Also, if the process temperature is higher than 600° C., it is not preferable because monosilane is thermally decomposed and a silicon film is deposited. Also, if the process pressure is lower than 27 Pa, it is not preferable because the pressure is too low that it is difficult for monosilane to be adsorbed. Also, if the process pressure is higher than 6665 Pa, it is not preferable because a plurality of layers of monosilane are adsorbed and it is difficult to control a concentration of boron in the film.

In the purging process (S2) right after the first gas supply process, a $N_2$ gas is supplied at a controlled flow rate from the gas nozzle 56A of the support gas supply unit 56. Here, the $N_2$ gas is used as a purge gas to remove a remaining monosilane gas in the process chamber 14. Here, the $N_2$ gas is not supplied for an entire period of the purging process, but is supplied for a specific period, for example, the $N_2$ gas is supplied for the first half period and is not supplied for the second half period during which only vacuum suction is continuously performed.

Process conditions at this time are as follows: a flow rate of the $N_2$ gas is, for example, up to about 5 slm, a process pressure ranges from 27 to 6665 Pa, a process temperature ranges from 350 to 600° C., and a purging period of time T2 ranges from 0 to 300 sec and is, for example, about 30 sec.

In the second gas supply process (S3) after the purging process, the $BCl_3$ gas is supplied at a controlled flow rate from the gas nozzle 54A of the impurity-containing gas supply unit 54. At the same time, a $N_2$ gas is supplied as a pressure adjusting gas at a controlled flow rate from the gas nozzle 56A of the support gas supply unit 56 (see the timing chart (C) of FIG. 2). The $BCl_3$ gas and the $N_2$ gas are raised in the process chamber 14, and the $BCl_3$ gas reacts with the monosilane adsorbed onto the surface of the semiconductor wafer W to form an amorphous silicon film containing boron. And, a residual gas is evacuated by the vacuum exhaust system 24 through the exhaust port 16 and the exhaust nozzle 18 of an upper portion of the process chamber 14.

Process conditions at this time are as follows: a flow rate of the $BCl_3$ gas ranges, for example, from 1 to 500 sccm, and is, for example, about 100 sccm, a flow rate of the $N_2$ gas is up to about 5 slm, a process pressure ranges from 27 to 6665 Pa (0.2 to 50 Torr) and is, for example, about 533 Pa (4 Torr), a process temperature ranges from 350 to 600° C. and is, for example, about 400° C., and a gas supply period of time T3 ranges from 1 to 300 sec and is, for example, about 60 sec.

Here, if the process temperature is lower than 350° C., it is not preferable because it is difficult for $BCl_3$ to react with the monosilane adsorbed onto the surface of the semiconductor wafer W, and if the process temperature is higher than 600° C., it is not preferable because a time is taken to increase temperature.

In the purging process (S4) right after the second gas supply process, a $N_2$ gas is supplied at a controlled flow rate from the gas nozzle 56A of the support gas supply unit 56 in the same manner as that in the purging process of the step S2. Actually, the $N_2$ gas is continuously supplied since the second gas supply process. Here, the $N_2$ gas is used as a purge gas, to remove a remaining $BCl_3$ gas in the process chamber 14. Here, the $N_2$ gas is not supplied for an entire period of the purging process, but is supplied for a specific period, for example, the $N_2$ gas is supplied for the first half period and is not supplied for the second half period during which only vacuum suction is continuously performed.

Process conditions at this time are the same as those in the purging process of the step S2. That is, a flow rate of the $N_2$ gas is, for example, up to about 5 slm. A process pressure ranges from 27 to 6665 Pa, a process temperature ranges from 350 to 600° C., and a purging period of a time T4 ranges from 0 to 300 sec and is, for example, about 30 sec.

The 1 cycle including processes of the steps S1 through S4 is repeatedly performed only a predetermined number of times. Although the number of cycles depends on a target film thickness of a film to be formed, since film formation is performed to have a film thickness of, for example, about 0.2 to 0.7 nm, during a 1 cycle, if a film thickness of, for example, about 60 nm is needed, 100 cycles are performed. As described above, a thin film such as a very thin amorphous silicon film having a thickness of an atomic level and doped with B (boron) as an impurity is stacked, so that the silicon film can be filled with good filling characteristics in the recess portions 4 (see FIGS. 12A and 12B) formed on the surface of the semiconductor wafer W.

Here, a film formation process of an amorphous silicon film doped with boron generated during the film formation will be explained with reference to a schematic view shown in FIGS. 4A through 4C. FIGS. 4A through 4C are views schematically showing results obtained when simulating a film formation process of an amorphous silicon film doped with boron by using quantum chemical calculation. An activation energy eV is shown under each picture. Here, particularly, the possibility of low temperature film formation by using alternate supply (ALD method) using $SiH_4$ and $BCl_3$ was verified by a simulation.

First, when $SiH_4$ introduced from the outside approaches a Si—B bonding that is already formed on a surface of a semiconductor wafer (see FIG. 4A), due to a catalysis by B atom, as shown in FIG. 4B, $H_2$ is removed from $SiH_4$ to generate $SiH_2$ which is easily introduced into a B-adsorbing spot. In detail, an activation energy of $SiH_2$ to the B-adsorbing spot is reduced to about 1.2 eV. Also, if B (boron) does not exist, an activation energy is about +2.4 eV. Next, as shown in FIG. 4C, a Si—Si bonding is continuously formed.

In this regard, it is deemed that since film formation is possible at a low temperature of about 350° C. at which practical film formation was impossible with supply of only $SiH_4$ in a conventional art, and ALD film formation is performed by alternately supplying gases, a thin film having a good step coverage is obtained.

Meanwhile, in a conventional CVD method in which only $SiH_4$ is used, practical film formation was almost impossible. Also, in a CVD method using only $Si_2H_6$, although film formation was possible even at a process temperature of 400° C., a step coverage thereof was about 80%, thereby failing to have excellent results.

As such, in the thin film formation method of forming a silicon film containing an impurity on the surface of the semiconductor wafer W in the process chamber 14 that allows vacuum exhaust, an amorphous silicon film containing an impurity is formed by alternately and repeatedly performing the first gas supply process in which a silane-based gas composed of silicon and hydrogen is supplied into the process chamber 14 in a state the silane-based gas is adsorbed onto the surface of the semiconductor wafer W and the second gas supply process in which an impurity-containing gas is supplied into the process chamber 14, and thereby an amorphous silicon film containing an impurity having good filling characteristics can be formed even at a relatively low temperature.

<Evaluation of the Method of the Present Invention>

Here, since an amorphous silicon film doped with boron was formed by actually performing the method of the present invention, evaluation results thereof will be explained. Here, a silicon substrate was used as a semiconductor wafer, a silicon oxide film was formed as a base layer on a surface of the silicon substrate, and recess portions each having a hole diameter of 50 nm and an aspect ratio of 7 were formed in the silicon oxide film. And, an amorphous silicon film doped with boron as an impurity was formed on the silicon oxide film.

As a film formation method, the film formation method described above with reference to the timing charts (A) through (C) of FIG. 2 was used. $SiH_4$ was used as a silane-based gas, and $BCl_3$ was used as an impurity-containing gas. Process conditions were as follows: a flow rate of a $SiH_4$ gas was 2000 sccm, a flow rate of a $BCl_3$ gas was 200 sccm, and a flow rate of a $N_2$ gas was 2 slm when being used as a purge gas and was 1 slm when being used as a pressure adjusting gas. A process temperature was set to 400° C. throughout the method, and a process pressure in each of the first gas supply process and the second gas supply process was 533 Pa (4 Torr). A process period of time T1 was 30 sec, T2 was 30 sec, T3 was 30 sec, and T4 was 30 sec.

Figure 5:
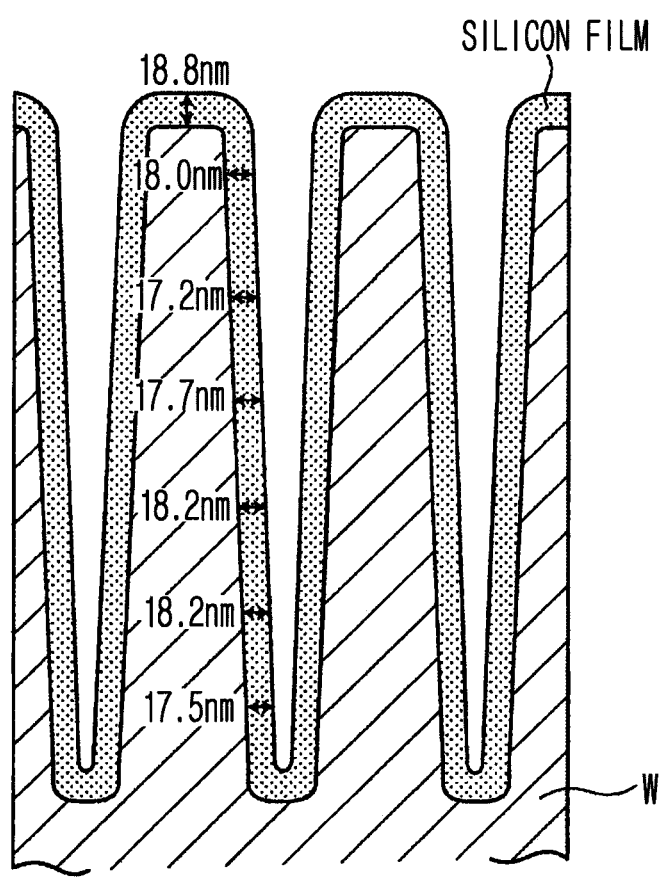
FIG. 5 is a view schematically showing an electron micrograph when an amorphous silicon film doped with boron is formed in recess portions by using an ALD method.

As such, after film formation was performed on a wafer having a surface having a trench structure, an amorphous silicon film doped with boron of 180 Å was obtained after 60 cycles. Results in this case are shown in FIG. 5. FIG. 5 is a view schematically showing an electron micrograph when an amorphous silicon film doped with boron is formed in recess portions by using an ALD method as described above. Here, a diameter of each of the recess portions is 50 nm, and also, an aspect ratio (A/R) of each of the recess portions is "7". In FIG. 5, film thicknesses along insides of the recess portions are shown. It is found from FIG. 5 that a step coverage is equal to or greater than 95% which are excellent results.

Also, although, in the first embodiment of the film formation method, a $N_2$ gas is supplied as a purge gas in the purging processes T2 and T4 and is supplied as a pressure adjusting gas in the second gas supply process as shown in the timing chart (C) of FIG. 2, the present invention is not limited thereto, and the $N_2$ gas may be supplied as described below. Timing charts (D) through (F) of FIG. 2 show a modified example of a $N_2$ gas supply type. In the timing chart (D) of FIG. 2, unlike in the timing chart (C) of FIG. 2, a $N_2$ gas is not supplied for the first half period in both purging processes before and after a second gas supply process, but is supplied for the second half period. And, in the second gas supply process, like in the timing chart (C) of FIG. 2, the $N_2$ gas is supplied as a pressure adjusting gas.

In the timing chart (E) of FIG. 2, a $N_2$ gas is supplied in both purging processes before and after the second gas supply process in the same manner as that in the timing chart (C) of FIG. 2, and in the second gas supply process, the $N_2$ gas (pressure adjusting gas) is not supplied. Also, in the timing chart (D) of FIG. 2, a $N_2$ gas may not be supplied in the second gas supply process.

In the timing chart (F) of FIG. 2, unlike the above, a $N_2$ gas (purge gas) is not supplied for an entire period of both purging processes before and after the second gas supply process, and in the second gas supply process, the $N_2$ gas (pressure adjusting gas) is supplied in the same manner as that in the timing chart (C) of FIG. 2. As such, a purge gas or a pressure adjusting gas may be supplied in various manners. The reason why a pressure adjusting gas is supplied in the second gas supply process as described above is that if a pressure is changed drastically in first and second gas supply processes, silicon migration easily occurs.

Second Embodiment

Next, a second embodiment of the film formation apparatus and the thin film formation method of the present invention will be explained. While an amorphous silicon film containing an impurity is formed in the first embodiment, an amorphous silicon germanium film containing an impurity is formed in the second embodiment.

Figure 6:
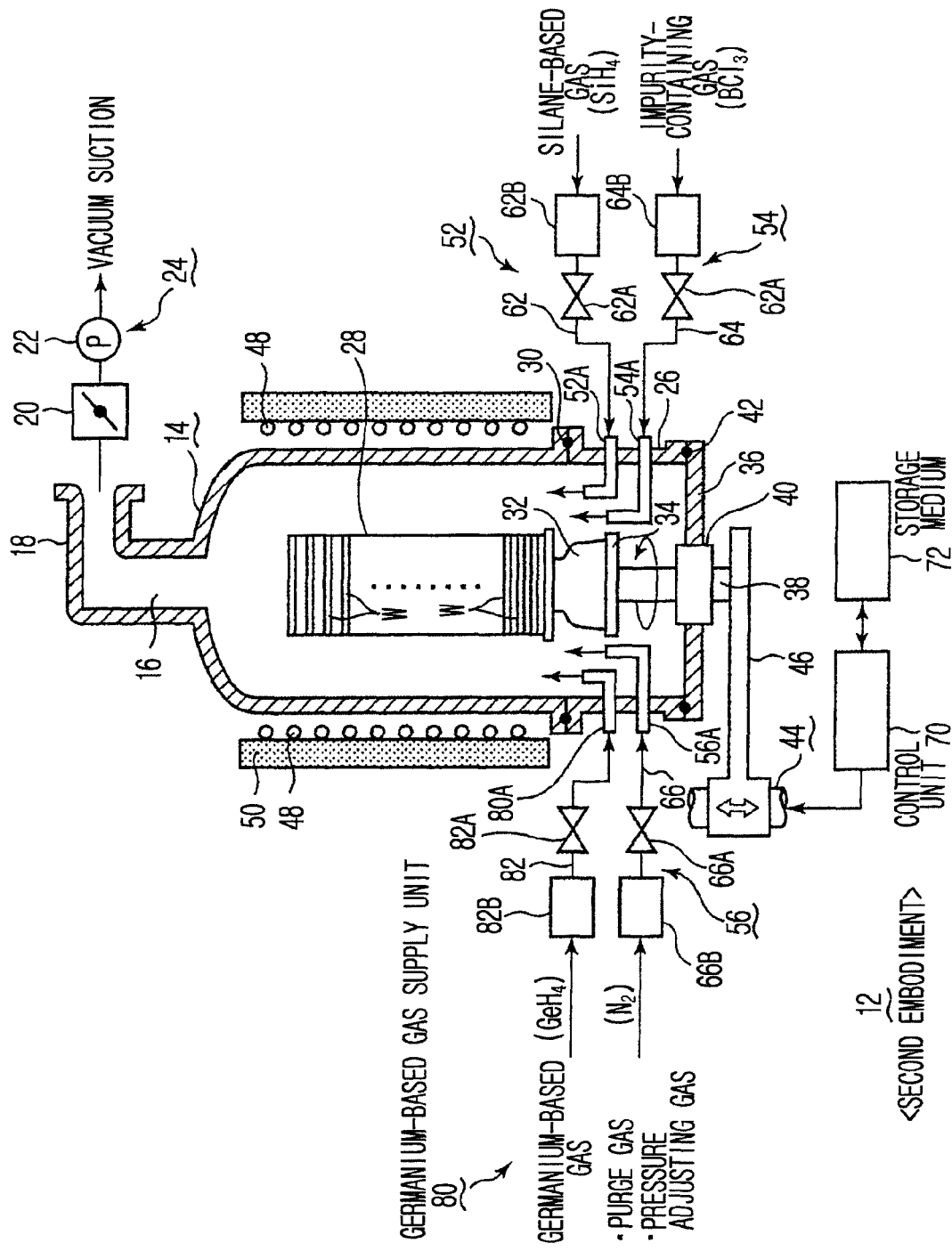
FIG. 6 is a structural view showing an example of a second embodiment of a film formation apparatus.
Figure 7:
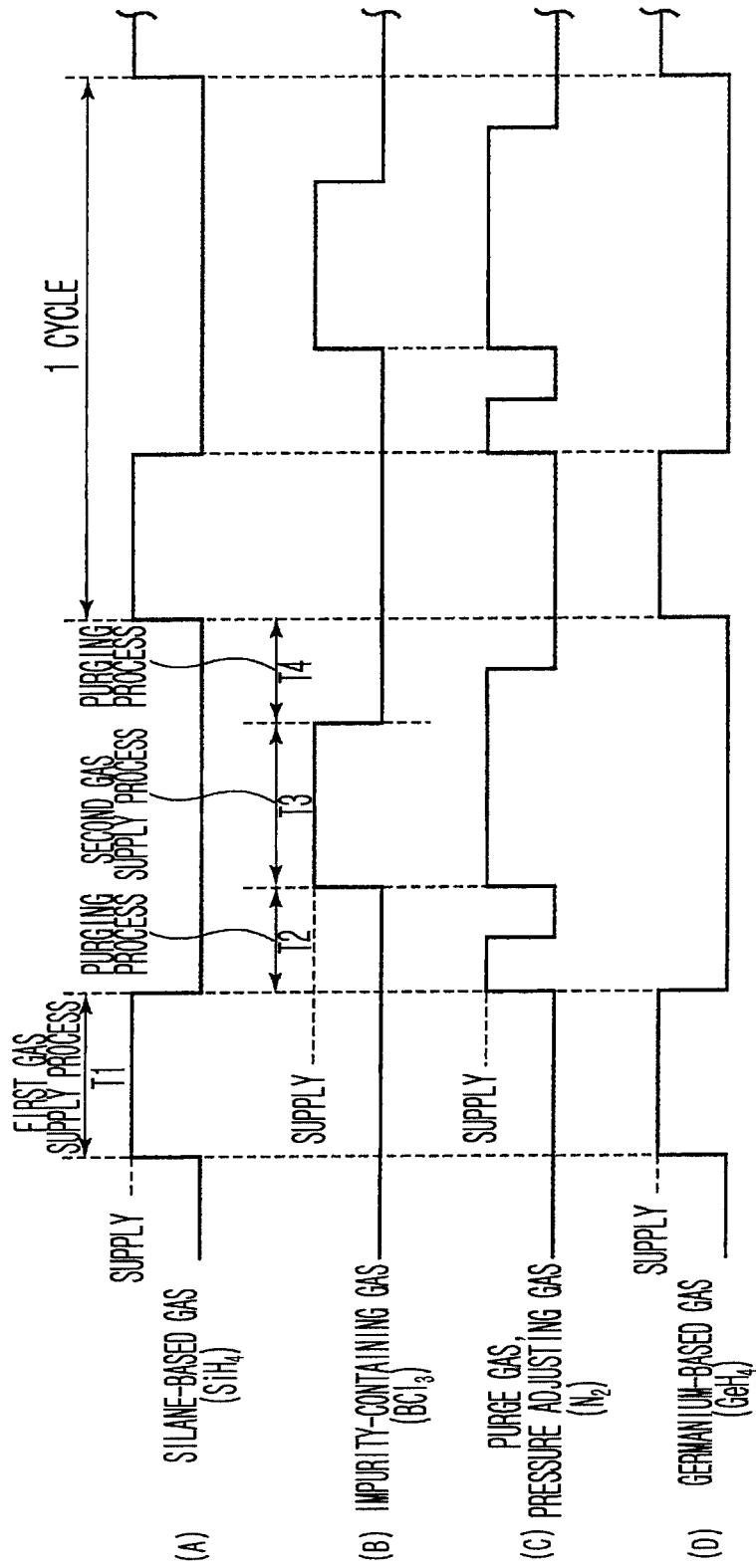
FIG. 7 is a timing chart showing an example of each gas supply type in a second embodiment of the method of the present invention.
Figure 8:
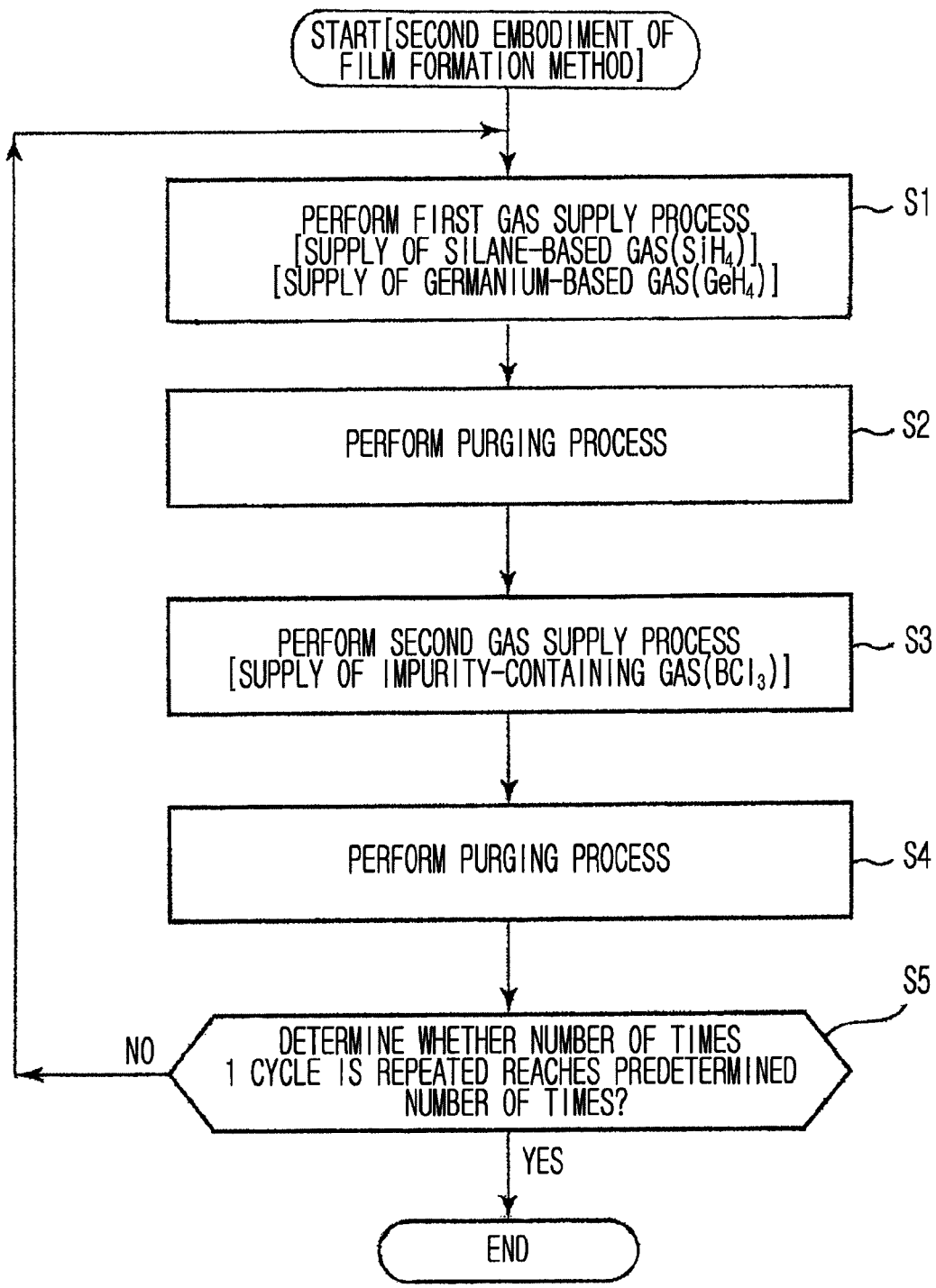
FIG. 8 is a flowchart showing an example of each process of the second embodiment of the method of the present invention.

FIG. 6 is a structural view showing an example of the second embodiment of the film formation apparatus, FIG. 7 is a timing chart showing an example of each gas supply type in the second embodiment of the method of the present invention, and FIG. 8 is a flowchart showing an example of each process of the second embodiment of the method of the present invention. Also, in FIGS. 6 through 8, the same portions as those shown in FIGS. 1 through 3 are denoted by the same reference numerals, and an explanation thereof will not be given.

As shown in FIG. 6, a film formation apparatus 12 according to the second embodiment, in order to form an amorphous silicon germanium film containing an impurity as a thin film as described above, includes a germanium-based gas supply unit 80 as gas supply units in addition to the silane-based gas supply unit 52, the impurity-containing gas supply unit 54, and the support gas supply unit 50 described above. The germanium-based gas supply unit 80, like the other gas supply systems, includes a gas nozzle 80A that penetrates through a side wall of the manifold 26 and has a front end portion extending into the process chamber 14.

A gas passage 82 is connected to the gas nozzle 80A, and an opening/closing valve 82A and a flow rate controller 82B, such as a mass flow controller, are sequentially installed in the gas passage 82, so that a germanium-based gas flows at a controlled flow rate. The germanium-based gas may include at least one gas selected from the group consisting of a $GeH_4$ gas, a $GeH_6$ gas, and a $Ge_2H_6$ gas, and herein the $GeH_4$ gas is used.

In the second embodiment of the film formation method performed by using the film formation apparatus 12 of the second embodiment, as shown in FIGS. 7 and 8, a $GeH_4$ gas (see a timing chart (D) of FIG. 7 and S1 of FIG. 8) is supplied into the process chamber 14 at the same time and in the same period with a $SiH_4$ gas that is a silane-based gas. That is, the $GeH_4$ gas is supplied in a first gas supply process (T1) of each cycle shown in FIG. 7, and film formation is performed by using an ALD method like in the first embodiment. Accordingly, boron (B) is introduced as an impurity into a film formed of silicon and germanium, thereby forming an amorphous silicon germanium film containing boron.

In this case, a purging process is performed in the same manner as that described in the first embodiment with reference to FIG. 2 and so on. Also, process conditions, for example, a process pressure, a process temperature, and a flow rate of each gas, in a first gas supply process, a second gas supply process, and a purging process, are the same as those described in the first embodiment. In this case, a flow rate of a germanium-based gas in the first gas supply process ranges from 100 to 2000 sccm, and is, for example, about 500 sccm.

Also, it would be understood that although various $N_2$ gas supply types have been explained in the first embodiment with reference to the timing charts (D) through (F) of FIG. 2, the various supply types may apply to the second embodiment.

As such, in a thin film formation method to form a silicon germanium film containing an impurity on a surface of an object to be processed in the process chamber 14 that allows vacuum exhaust, an amorphous silicon germanium film containing an impurity is formed by alternately and repeatedly performing a first gas supply process in which a silane-based gas composed of silicon and hydrogen and a germanium-based gas composed of germanium and hydrogen are supplied into the process chamber 14 in a state that the silane-based gas and the germanium-based gas are adsorbed onto the surface of the semiconductor wafer W and a second gas supply process in which an impurity-containing gas is supplied into the process chamber 14, and thereby an amorphous silicon germanium film containing an impurity having good filling characteristics can be formed even at a relatively low temperature.

Third Embodiment

Figure 9A:
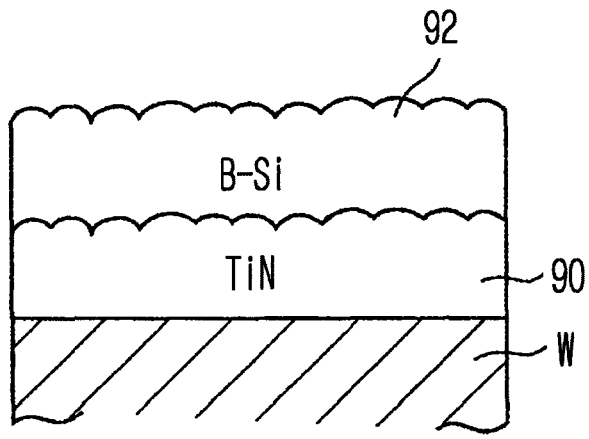
FIGS. 9A through 9C are views for explaining a process of a third embodiment of the method of the present invention.
Figure 9B:
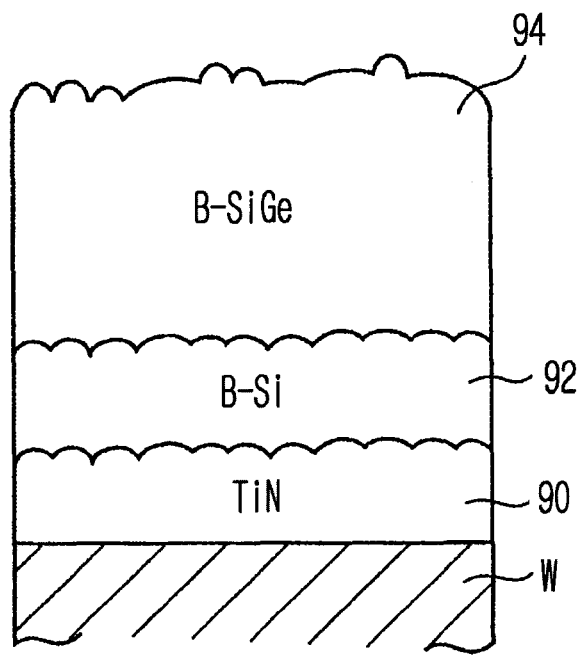
Figure 9C:
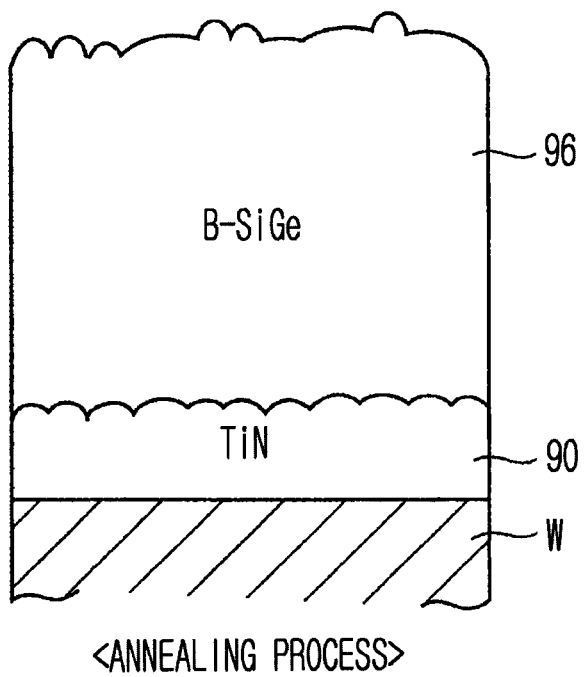

Next, a third embodiment of the method of the present invention will be explained. While an amorphous silicon film doped with boron is formed as a thin film in the first embodiment and an amorphous silicon germanium film doped with boron is formed as a thin film in the second embodiment in the film formation method as described above, a combination thereof may be possible. FIGS. 9A through 9C are views for explaining a process of the third embodiment of the method of the present invention. Here, a case where each thin film is formed on a conductive film and then an annealing process is additionally and finally performed will be exemplarily explained.

First, as shown in FIG. 9A, a conductive film 90 is formed on a surface of a semiconductor wafer W as an object to be processed. For example, a TiN film or the like which is often used as an electrode is used as the conductive film 90. An amorphous silicon film 92 doped with boron is formed as a thin film on the conductive film 90 by using the first embodiment or its modified embodiment of the film formation method.

Next, as shown in FIG. 9B, an amorphous silicon germanium film 94 doped with boron is formed as a thin film on the silicon film 92 by using the second embodiment or its modified example of the film formation method. Here, a thickness of the silicon film 92 is equal to or less than, for example, 2 nm, and a thickness of the silicon germanium film 94 is equal to or less than, for example, 90 nm. In this case, if the film formation apparatus of the second embodiment shown in FIG. 6 is used, the silicon film 92 and the silicon germanium film 94 can be continuously formed with one film formation apparatus.

Next, as shown in FIG. 9C, an annealing process is performed on each thin film to diffuse and mix germanium of the silicon germanium film 94 in both the thin films 92 and 94, thereby forming a mixed film 96. A temperature of the annealing process ranges from, for example, 410 to 500° C. Also, the annealing process may be performed and may not be performed, if necessary.

Here, since a thickness of the silicon germanium film 94 is, for example, 90 nm which is thick, it is preferable that when the silicon germanium film 94 is formed, the silicon germanium film 94 is formed to a middle thickness, for example, about 10 nm by using the second embodiment of the film formation method, and a silicon germanium film doped with boron may be formed to a remaining thickness of 80 nm by using a CVD (Chemical Vapor Deposition) method that is a conventional film formation method. Even in this case, it is preferable that an annealing process is finally performed.

As such, by forming the mixed film 96, in order to fill recess portions, for example, trench portions, if a B—Si film doped with boron is formed as a seed layer and then a B—SiGe film doped with boron is formed, a good step coverage and excellent filling characteristics can be obtained even at low temperature film formation.

<Application Example of Semiconductor Device>

Figure 10:
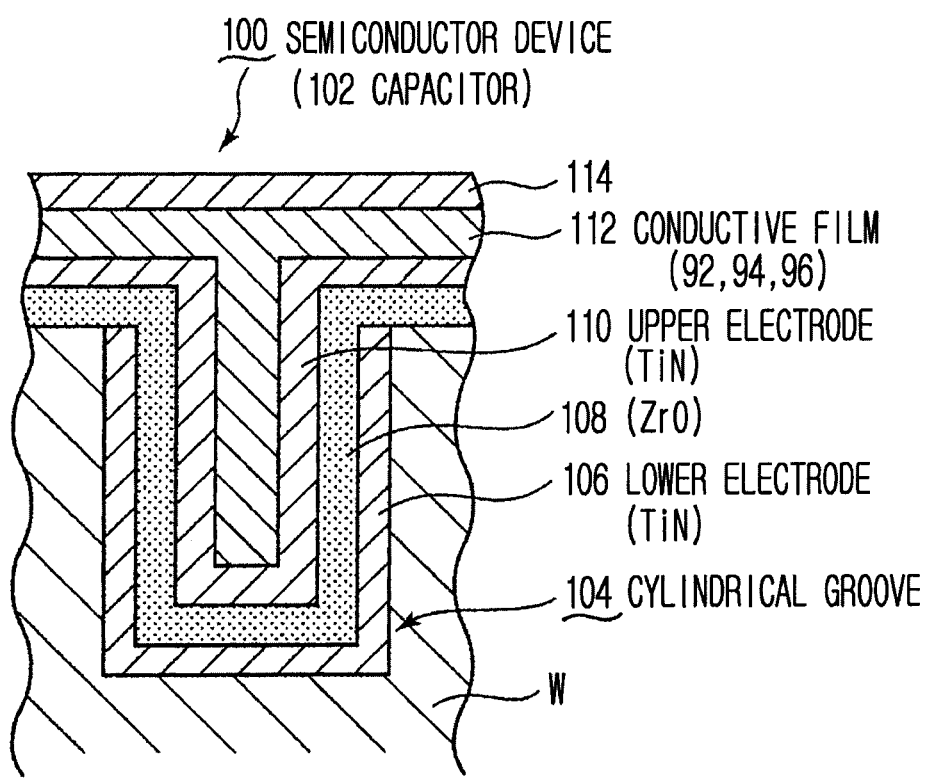
FIG. 10 is an enlarged cross-sectional view showing an example of a semiconductor device using a thin film formed by the method of the present invention.

Next, an application example of a semiconductor device using a thin film formed by the method of the present invention will be explained. FIG. 10 is an enlarged cross-sectional view showing an example of a semiconductor device using a thin film formed by the method of the present invention. A semiconductor device 100 includes, for example, a capacitor 102 having a cylindrical structure. In detail, the capacitor 102 is provided in a fine cylindrical groove 104 having a recess shape formed on a surface of a semiconductor wafer W including, for example, a silicon substrate.

That is, the capacitor 102 has a lower electrode 106 formed along an inner wall of the cylindrical groove 104 having the recess shape, and a high dielectric constant film 108 and an upper electrode 110 are sequentially stacked on the lower electrode 106. For example, a TiN film may be used as each of the lower electrode 106 and the upper electrode 110, and for example, zirconium oxide (ZrO) may be used for the high dielectric constant film 108.

And, the cylindrical groove 104 is filled in by forming a conductive film 112 on the upper electrode 110, and a wiring film 114 including, for example, a tungsten film, is formed on the conductive film 112 by using sputtering or the like. Here, the silicon film 92, the silicon germanium film 94, or the mixed film 96 (see FIGS. 9A through 9C) formed by the method of the present invention is used as the conductive film 112 filled in the cylindrical groove 104.

When the cylindrical groove 104 of the capacitor 102 having the cylindrical structure is filled, a conventional film formation method of forming a silicon germanium film doped with boron by using, for example, a CVD method, cannot achieve a sufficient step coverage and thus is not practical. However, by employing the film formation method according to the method of the present invention as described above, the cylindrical groove 104 can be filled with a high step coverage.

Also, due to the thin film formed by the method of the present invention as described above, that is, the silicon film 92, the silicon germanium film 94, or the mixed film 96, durability against mechanical stress between the wiring film 114 formed by using sputtering and the upper electrode 110 formed of a TiN film can be improved.

Fourth Embodiment

Next, a fourth embodiment of the method of the present invention will be explained. Although the amorphous silicon film 92 doped with boron or the like is formed on the upper electrode 110 formed of, for example, a TiN film, in the application example of the semiconductor device shown in FIG. 10, here, a stacked structure obtained by alternately stacking a plurality of times a TiN film as the upper electrode 110 and the amorphous silicon film 92 doped with boron may be employed. Accordingly, a stress of the upper electrode 110 itself can be reduced.

Figure 11:
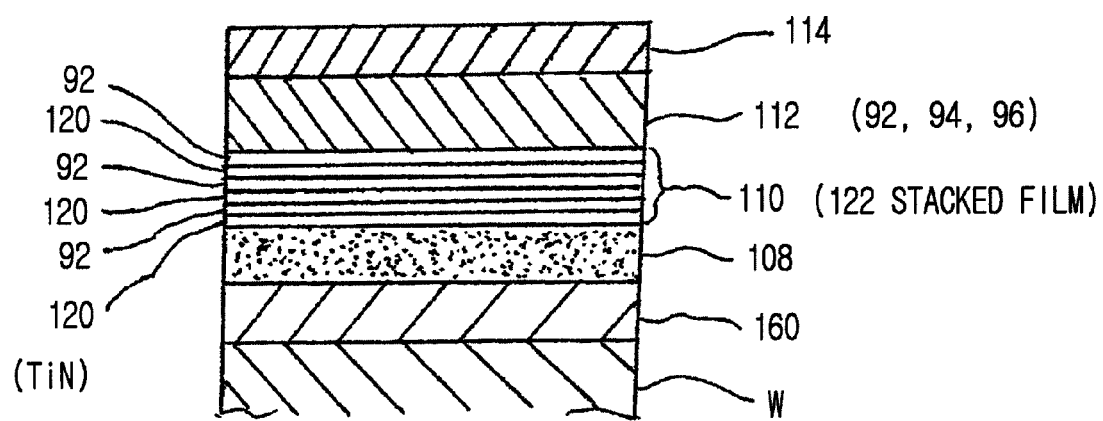
FIG. 11 is a cross-sectional view showing an upper electrode and its vicinity for explaining a fourth embodiment of the method of the present invention.

FIG. 11 is a cross-sectional view showing an upper electrode and its vicinity for explaining the fourth embodiment of the method of the present invention. Here, only order of stacking films is shown and a cylindrical groove is not shown. Also, the same portions as those in the stacked structure shown in FIG. 10 are denoted by the same reference numerals.

In the fourth embodiment, instead of a thick TiN film as the upper electrode 110 as described above, a stacked film 122 obtained by alternately and repeatedly forming a plurality of times a thin TiN film 120 as shown in FIG. 11 and the thin amorphous silicon film 92 doped with boron formed by the method of the present invention is used. In FIG. 11, although the TiN film 120 and the silicon film 92 are repeatedly formed 3 times, the number of times the TiN film 120 and the silicon film 92 are formed is not specially limited. In the upper electrode 110 of FIG. 11, a thickness of one layer of the silicon film 92 is, for example, about 5 to 15 nm, and a thickness of one layer of the TiN film 120 is, for example, about 5 to 20 nm.

In order to form the TiN film 120, a titan-containing gas supply unit and a nitridation gas supply unit may be provided in the film formation apparatus shown in FIG. 1 or 6, and these gases may be supplied at controlled flow rates. For example, a $TiCl_4$ gas may be used as the titan-containing gas, and a $NH_3$ gas may be used as the nitridation gas, but the present invention is not limited to the gas types. The TiN film 120 may be formed by using a CVD method by supplying both the gases at the same time into the process chamber, or may be formed by using an ALD method by alternately and repeatedly supplying both the gases into the process chamber.

Accordingly, as described above, a stress of the upper electrode 110 itself can be reduced. Also, the upper electrode 110 including the stacked film 122 and the conductive film 112 may be continuously formed in the same film formation apparatus. Also, on the upper electrode 110 including the stacked film 122, as described in FIG. 10, the silicon film 92, the silicon germanium film 94, or the mixed film 96 may be stacked as the conductive film 112.

Also, although an $N_2$ gas is intermittently supplied in each embodiment of the film formation method, the present invention is not limited thereto, and the $N_2$ gas may be continuously supplied for an entire period of film formation, so as not to greatly change a pressure.

Also, although an $N_2$ gas is used as a purge gas in each purging process or as a pressure adjusting gas in the second gas supply process in each embodiment of the film formation method, a rare gas, such as Ar, He, or the like, may be used instead of the $N_2$ gas. Also, although an $N_2$ gas is used as a purge gas in each purging process or as a pressure adjusting gas in the second gas supply process in each embodiment of the film formation method, a $H_2$ gas may be used alone or by being mixed with the $N_2$ gas or the rare gas, instead of the $N_2$ gas or the rare gas. In particular, if the $H_2$ gas is used, the $H_2$ gas suppresses silicon migration to prevent particles of a silicon film from being attached, thereby further improving filling characteristics.

Although a pressure adjusting gas is mainly supplied in the second gas supply process in each embodiment of the film formation method, a pressure adjusting gas may be supplied in the first gas supply process instead of the second supply process, or in both the first and second gas supply processes. Also, although monosilane is exemplarily used as a silane-based gas composed of silicon and hydrogen in each embodiment, the present invention is not limited thereto, and one or more types of gas selected from the group consisting of monosilane and higher order silane such as disilane, trisilane, tetrasilane, or the like may be used.

Also, although a $BCl_3$ gas is used in order to contain an impurity (dopant) in an amorphous silicon film or a silicon germanium film in each embodiment of the film formation method, the present invention is not limited thereto, and one or more types of gas selected from the group consisting of $BCl_3$, $PH_3$, $PF_3$, $AsH_3$, $PCl_3$, and $B_2H_6$ may be used as the impurity-containing gas and various impurities may be doped.

Also, although as shown in FIGS. 1 and 6, a single-tube batch type film formation apparatus in which the process chamber 14 is provided in a single layer is exemplarily explained here, the present invention is not limited thereto, and the present invention can be applied to a double-tube batch type film formation apparatus in which the process chamber 14 includes an inner container and an outer container. Also, although the gas nozzles 52A, 54A, 56A, and 80A are each a straight-type gas nozzle in which a gas is ejected only from a leading end of the gas nozzle, the present invention is not limited thereto, and a so-called distribution-type gas nozzle in which a plurality of gas ejection holes are provided at predetermined pitches in a gas pipe disposed along a longitudinal direction of the process chamber 14 and a gas is ejected from each of the gas ejection holes may be used.

Also, although a batch type film formation apparatus which processes a plurality of semiconductor wafers W at one time as described above is exemplarily explained, the present invention is not limited thereto, and the present invention can be applied to a so-called single wafer type film formation apparatus which processes one semiconductor wafer W.

Also, although, here, a semiconductor wafer is exemplarily explained as an object to be processed, the semiconductor wafer may be a silicon substrate, or a compound semiconductor substrate, such as GaAs, SiC, GaN, or the like, and also the present invention is not limited thereto, and the present invention can be applied to a glass substrate used in a liquid crystal display device, a ceramic substrate, and so on.

The thin film formation method and the film formation apparatus according to the present invention can have the following excellent effects.

According to the invention according to claim 1 and claims which are dependent upon claim 1, in a thin film formation method to form a silicon film containing an impurity on a surface of an object to be processed in a process chamber that allows vacuum exhaust, an amorphous silicon film containing an impurity is formed by alternately and repeatedly performing a first gas supply process in which a silane-based gas composed of silicon and hydrogen is supplied into the process chamber in a state that the silane-based gas is adsorbed onto the surface of the object to be processed and a second gas supply process in which an impurity-containing gas is supplied into the process chamber, and thereby an amorphous silicon film containing an impurity having good filling characteristics can be formed even at a relatively low temperature.

According to the invention according to claim 8 and claims which are dependent upon claim 8, in a thin film formation method to form a silicon germanium film containing an impurity on a surface of an object to be processed in a process chamber that allows vacuum exhaust, an amorphous silicon germanium film containing an impurity is formed by alternately and repeatedly performing a first gas supply process in which a silane-based gas composed of silicon and hydrogen and a germanium-based gas composed of germanium and hydrogen into the process chamber in a state that the silane-based gas and the germanium-based gas are adsorbed onto the surface of the object to be processed and a second gas supply process in which an impurity-containing gas is supplied into the process chamber, and thereby an amorphous silicon germanium film containing an impurity having good filling characteristics can be formed even at a relatively low temperature.

What is claimed is:

1. A thin film formation method to form an amorphous silicon germanium film containing an impurity on a surface of an object to be processed in a process chamber that allows vacuum exhaust, the method comprising:

supplying a silane-based gas composed of silicon and hydrogen and a germanium-based gas composed of germanium and hydrogen into the process chamber in a state that the silane-based gas and the germanium-based gas are adsorbed onto the surface of the object;

supplying an impurity-containing gas into the process chamber to form the amorphous silicon germanium film containing the impurity; and performing the supplying of the silane-based gas and the germanium-based gas and the supplying of the impurity-containing gas alternately and repeatedly such that the impurity reacts with the silane-based gas and the germanium-based gas.

2. The thin film formation method of claim 1, wherein a process temperature in each of the supplying of the silane-based gas and the germanium-based gas and the supplying of the impurity-containing gas ranges from 350 to 600° C.

3. The thin film formation method of claim 1, wherein a process pressure in each of the supplying of the silane-based gas and the germanium-based gas and the supplying of the impurity-containing gas ranges from 27 to 6665 Pa (0.2 to 50 Torr).

4. The thin film formation method of claim 1, wherein in at least one gas supply process of the supplying of the silane-based gas and the germanium-based gas and/or the supplying of the impurity-containing gas, a pressure adjusting gas is supplied.

5. The thin film formation method of claim 1, wherein the silane-based gas comprises one or more types of gas selected from a group consisting of monosilane and higher order silane.

6. The thin film formation method of claim 1, wherein the germanium-based gas comprises one or more types of gas selected from a group consisting of a $GeH_4$ gas, a $GeH_6$ gas, and a $Ge_2H_6$ gas.

7. The thin film formation method of claim 1, wherein the impurity-containing gas comprises one or more types of gas selected from a group consisting of $BCl_3$, $PH_3$, $PF_3$, $AsH_3$, $PCl_3$, and $B_2H_6$.

8. A thin film formation method, the method comprising performing the thin film formation method of claim 1 and then performing the thin film formation method of claim 1.

9. The thin film formation method of claim 8, further comprising performing an annealing process after forming all of the thin films.

* * * * *